US012761753B2

(12) United States Patent
Liu et al.

(10) Patent No.: US 12,761,753 B2
(45) Date of Patent: Oct. 13, 2026

(54) SENSING CIRCUIT WITH SIGNAL COMPENSATION

(71) Applicant: SITRONIX TECHNOLOGY CORP., Jhubei City (TW)

(72) Inventors: Tzu-Hsuan Liu, Jhubei City (TW); Hung-Yen Tai, Jhubei City (TW); Chen-Yuan Yang, Jhubei City (TW)

(73) Assignee: Xmyth IP Group Limited, Apia (WS)

(*) Notice: Subject to any disclaimer, the term of this patent is extended or adjusted under 35 U.S.C. 154(b) by 938 days.

(21) Appl. No.: 17/655,034

(22) Filed: Mar. 16, 2022

(65) Prior Publication Data

US 2022/0300109 A1 Sep. 22, 2022

Related U.S. Application Data

(60) Provisional application No. 63/161,463, filed on Mar. 16, 2021.

(51) Int. Cl.
*G06F 3/041* (2006.01)
*H03F 3/45* (2006.01)

(52) U.S. Cl.
CPC ....... *G06F 3/0418* (2013.01); *H03F 3/45475* (2013.01)

(58) Field of Classification Search
CPC .... G06F 3/0418; G06F 3/044; H03F 3/45475; H03F 2200/213; H03F 2203/45512; H03F 2203/45536; H03F 2203/45548; H03F 2203/45551; H03F 2203/45588; H03F 2203/45616
USPC .......................................................... 330/252
See application file for complete search history.

(56) References Cited

U.S. PATENT DOCUMENTS

| | | | | |
|---|---|---|---|---|
| 2010/0309165 | A1* | 12/2010 | Kobayashi | G06F 3/04166 345/174 |
| 2013/0154997 | A1* | 6/2013 | Lin | G06F 3/04166 345/173 |
| 2013/0269177 | A1 | 10/2013 | Kobayashi et al. | |
| 2021/0011066 | A1* | 1/2021 | Maccioni | G01R 27/14 |

FOREIGN PATENT DOCUMENTS

| | | |
|---|---|---|
| TW | 201223136 A | 6/2012 |
| TW | 201421331 A | 6/2014 |

OTHER PUBLICATIONS

Office Action with appended Search Report which was issued to Taiwanese counterpart application No. 11121238490/111109692 on Dec. 15, 2022.
Office Action mailed to Taiwanese Counterpart Patent Application No. 111109692 on Jan. 2, 2024.

(Continued)

*Primary Examiner* — Jessica Han
*Assistant Examiner* — Jose E Pinero
(74) *Attorney, Agent, or Firm* — Rosenberg, Klein & Lee

(57) ABSTRACT

The present invention relates to a sensing circuit with signal compensation, which comprises a first sensing element, a second sensing element and a differential amplifying circuit, the differential amplifying circuit generates an output signal through a differential compensation according to a common mode voltage, a first sensing signal and a second sensing signal. Hereby, reducing the noise of the sensing circuit is achieved, and the interference of the display driving signal may be effectively improved.

6 Claims, 5 Drawing Sheets

(56) References Cited

OTHER PUBLICATIONS

Search Report mailed to Taiwanese Counterpart Patent Application No. 111109692 on Jan. 2, 2024.
Official Action mailed to Corresponding Chinese Patent Application No. 202210262214.0 dated Jan. 17, 2025.

* cited by examiner

SENSING CIRCUIT WITH SIGNAL COMPENSATION

FIELD OF THE INVENTION

The present invention relates generally to a sensing circuit, and particularly to a sensing circuit with signal compensation.

BACKGROUND OF THE INVENTION

As technologies developed, to meet the market trend and people's demand for modern mobile devices, the displays of the modem mobile devices become thinner and thinner, which is led to increase the parasitic capacitance between display electrodes and touch-panel electrodes significantly. The increased parasitic capacitance will lead to the occurrence of the output saturation problem on the touch sensors of the touch panel.

Please refer to FIG. 1. According to the prior art, to solve the output saturation problem due to large parasitic capacitance, an extremely large compensation capacitor $C_{OFTV}$ or an extremely large voltage $V_{OFTV}$ is adopted. Please refer to FIG. 2. Alternatively, a current source DAC may be used. Unfortunately, the current source DAC requires an extremely large current $I_{DAC}$ to supply massive compensation charges for canceling the offset voltage. No matter using the compensation capacitor or the current source DAC, in addition to generate larger noise, the compensation methods cannot cancel the interference caused by display driving signals on the touch panel, and hence, the performance of touch control is affected.

To solve the above problems, the present invention provides a sensing circuit with signal compensation. By using a differential amplifying circuit, in addition to reducing noise in the sensing circuit, the interference problem caused by display driving signals may be improved as well.

SUMMARY

An objective of the present invention is to provide a sensing circuit with signal compensation, which adopts a differential amplifying circuit and differential compensation to improve the problem of parasitic capacitance between display electrodes and touch-panel electrodes.

Another objective of the present invention is to provide a sensing circuit with signal compensation, which comprises a first sensing device, a second sensing device, and a differential amplifying circuit. The differential amplifying circuit generates an output signal according to a common-mode voltage, a first sensing signal, and a second sensing signal and using differential compensation. In addition to reducing noise in the sensing circuit, the interference caused by the display driving signals may be improved as well.

To achieve the above objectives, the present invention provides a sensing circuit with signal compensation. By coupling a first sensing device and a second sensing device with a differential amplifying circuit, respectively, the noise in the sensing circuit may be cancelled. Furthermore, the influence of common-mode noise on the operations of touch panels may be avoided. Thereby, the quality of display panels may be increased.

DETAILED DESCRIPTION

In the specifications and subsequent claims, certain words are used for representing specific devices. A person having ordinary skill in the art should know that hardware manufacturers might use different nouns to call the same device. In the specifications and subsequent claims, the differences in names are not used for distinguishing devices. Instead, the differences in functions are the guidelines for distinguishing. In the whole specifications and subsequent claims, the word "comprising" is an open language and should be explained as "comprising but not limited to". Besides, the word "couple" includes any direct and indirect electrical connection. Thereby, if the description is that a first device is coupled to a second device, it means that the first device is connected electrically to the second device directly, or the first device is connected electrically to the second device via other device or connecting means indirectly.

According to the prior art, no matter using a capacitor $C_{OFTV}$ or a current source DAC, an extremely high voltage $V_{OFTV}$ or a large current $I_{DAC}$ is required for providing massive compensation charges to cancel the offset voltage. Unfortunately, in addition to inducing more noise, this method cannot cancel the interference caused by the display driving signals on the display panels. Accordingly, the present invention provides a sensing circuit with signal compensation for solving the problem of increased noise in circuits due to the parasitic capacitance between the display electrodes of driving element IC and the touch-panel electrodes according to the prior art.

Figure 1:
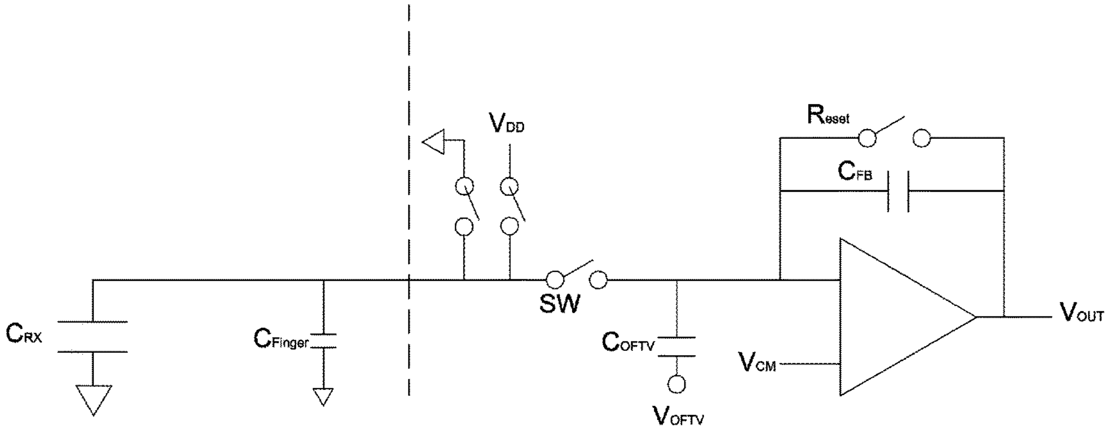
FIG. 1 shows a circuit diagram according to the first embodiment of the prior art.
Figure 2:
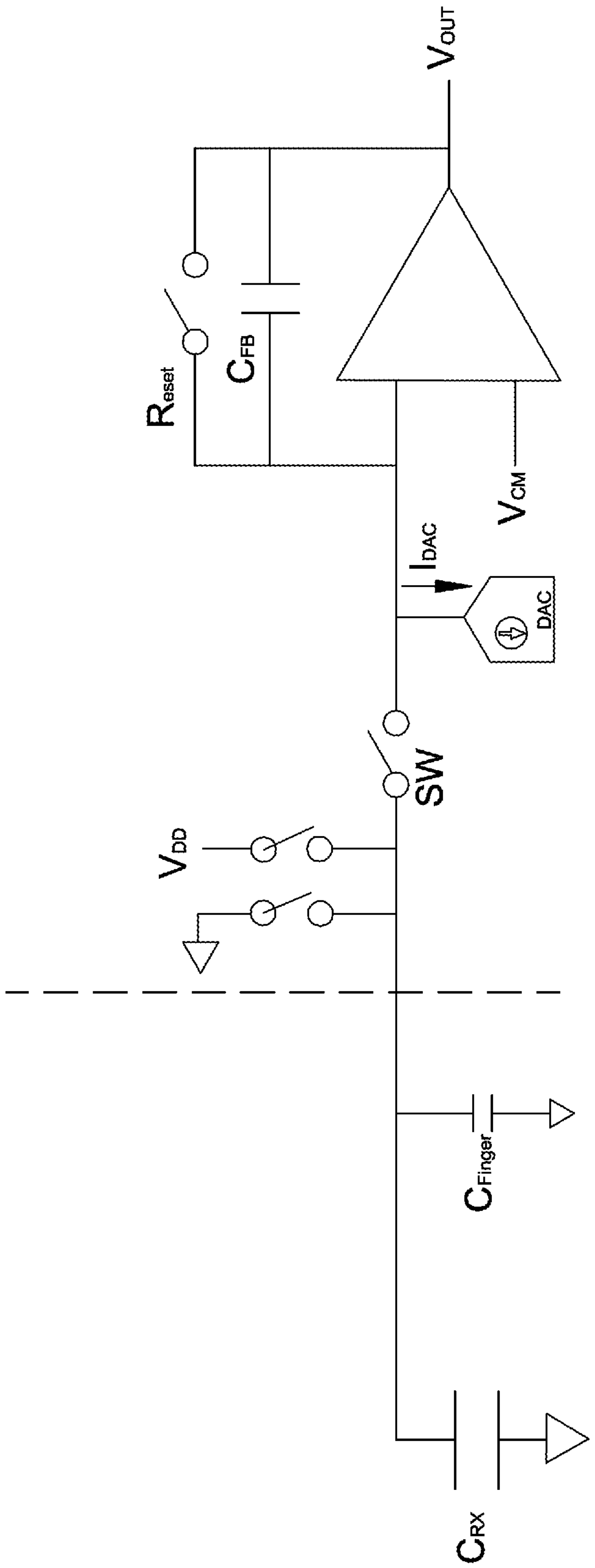
FIG. 2 shows a circuit diagram according to the second embodiment of the prior art.
Figure 3:
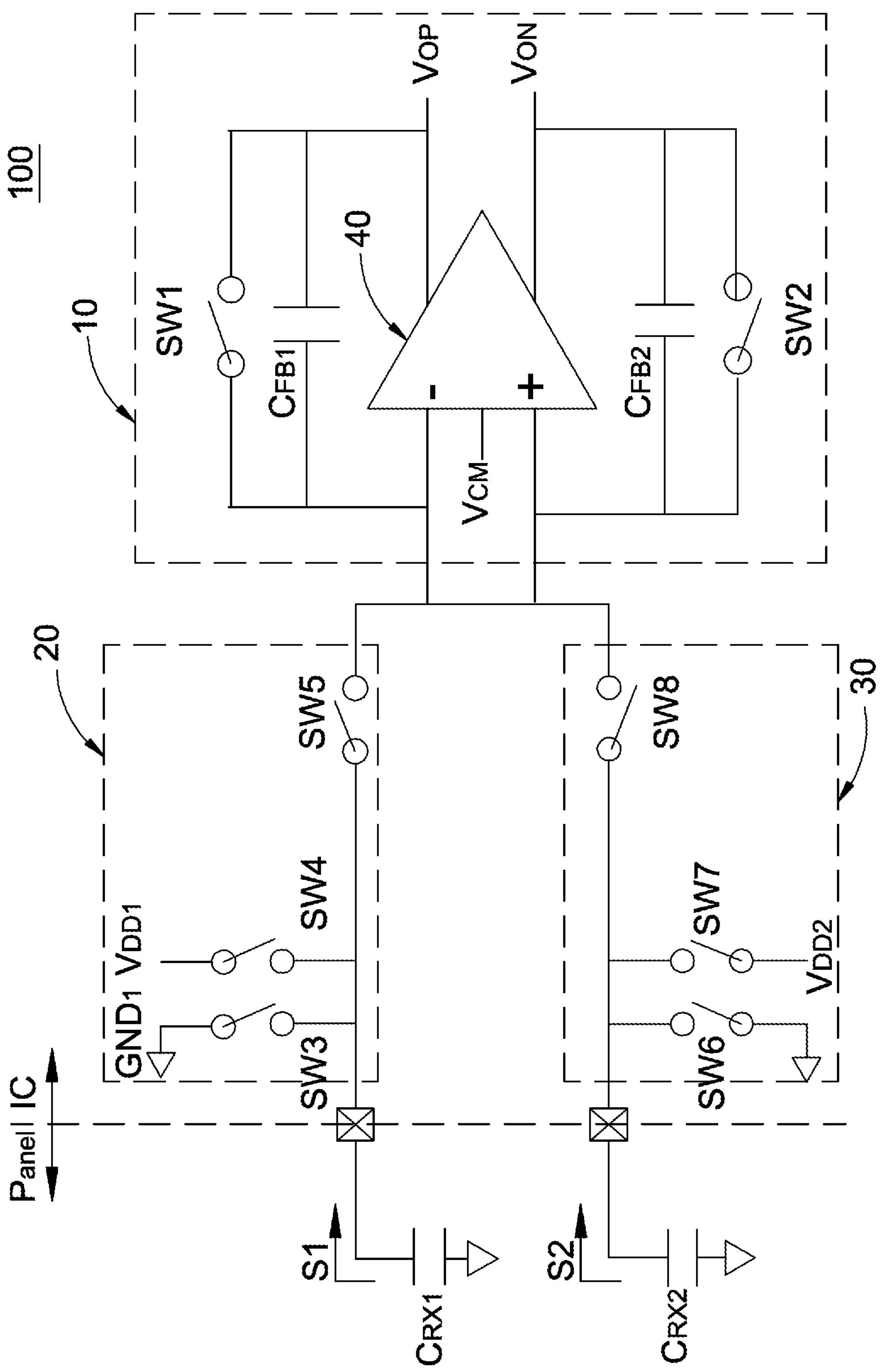
FIG. 3 shows a circuit diagram of the sensing circuit with signal compensation according the first embodiment of the present invention.

First, please refer to FIG. 3, which shows a circuit diagram of the sensing circuit with signal compensation according the first embodiment of the present invention. As shown in the figure, the sensing circuit 100 with signal compensation, according to the present invention, comprises a first sensing device $C_{RX1}$, a second sensing device $C_{RX2}$, and a differential amplifying circuit 10. The differential amplifying circuit 10 is coupled to the first sensing device $C_{RX1}$ and the second sensing device $C_{RX2}$. According to a first sensing signal S1 generated by the first sensing device $C_{RX1}$, a second sensing signal S2 generated by the second sensing device $C_{RX2}$, a common-mode voltage $V_{CM}$, and differential compensation, output signals $V_{OP}$ and $V_{ON}$ are generated. According to an embodiment of the present invention, the first sensing device $C_{RX1}$ receives a first driving voltage $VDD_1$ for generating the first sensing signal S1; the second sensing device $C_{RX2}$ receives a second driving voltage VDD2 for generating the second sensing signal S2. Since the electrical characteristics of the capacitance value of the first sensing device $C_{RX1}$ and the capacitance value of the second sensing device $C_{RX2}$ are approximate, the differential amplifying circuit 10 may generate the output signals $V_{OP}$ and $V_{ON}$ by differentially compensating the first sensing signal S1, the second sensing signal S2, and the common-mode voltage $V_{CM}$, thereby, the common-mode noise of the differential amplifying circuit 10 is cancelled. By solving the problem of parasitic capacitance between the display electrodes and the touch-panel electrodes, the noise problem of the sensing circuit may be improved.

According to the present embodiment, the sensing circuit 100 with signal compensation according to the present invention further comprises a first switching circuit 20, which includes a third switch SW3, a fourth switch SW4, and a fifth switch SW5. One terminal of the third switch SW3, the fourth switch SW4, and the fifth switch SW5 is coupled to the first sensing device $C_{RX1}$. According to an embodiment of the present invention, the other terminal of the third switch SW3 is coupled to a first ground $GND_1$; the other terminal of the fourth switch SW4 is coupled to the first driving voltage $VDD_1$; and the other terminal of the fifth switch SW5 is coupled to the differential amplifying circuit 10. When the first driving voltage $VDD_1$ is inputted to the first sensing device $C_{RX1}$ via the fourth switch SW4 or the first ground $GND_1$ is inputted to the first sensing device $C_{RX1}$ via the third switch SW3, the first sensing signal S1 will be generated.

According to the present embodiment, the sensing circuit 100 with signal compensation according to the present invention further comprises a second switching circuit 30, which includes a sixth switch SW6, a seventh switch SW7, and an eighth switch SW8. One terminal of the six switch SW6, the seventh switch SW7, and the eighth switch SW8 is coupled to the second sensing device $C_{RX2}$. According to an embodiment of the present invention, the other terminal of the sixth switch SW6 is coupled to a second ground $GND_2$; the other terminal of the seventh switch SW7 is coupled to the second driving voltage $VDD_2$; and the other terminal of the eighth switch SW8 is coupled to the differential amplifying circuit 10. When the second driving voltage $VDD_2$ is inputted to the second sensing device $C_{RX2}$ via the seventh switch SW7 or the second ground $GND_2$ is inputted to the second sensing device $C_{RX2}$ via the sixth switch SW6, the second sensing signal S2 will be generated. The first ground $GND_1$ is essentially identical to the second ground $GND_2$; and the first driving voltage $VDD_1$ is essentially identical to the second driving voltage $VDD_2$. Furthermore, by using the property of the approximation between the capacitance of the first sensing device $C_{RX1}$ and the capacitance of the second sensing device $C_{RX2}$, as well as using a simple compensation capacitor array, the mismatch in the differential amplifying circuit 10 may be compensated. The common-mode signal of the first sensing device $C_{RX1}$ and the second sensing device $C_{RX2}$ may be cancelled at the input of the first stage. According to another embodiment, the first ground $GND_1$ is different from the second ground $GND_2$; the first driving voltage $VDD_1$ is different from the second driving voltage $VDD_2$. By using a simple compensation capacitor array, the mismatch between the first sensing device $C_{RX1}$ and the second sensing device $C_{RX2}$ may be compensated. Namely, the common-mode signal of the first sensing device $C_{RX1}$ and the second sensing device $C_{RX2}$ may be cancelled at the input of the first stage.

According to the present embodiment, the differential amplifying circuit 10 further includes a differential amplifier 40, which includes a first input, a second input, a third input, a first output, and a second output. According to an embodiment of the present invention, the first input of the amplifier 40 is used for receiving the first sensing signal S1 of the first sensing device $C_{RX1}$; the second input of the amplifier 40 is used for receiving the second sensing signal S2 of the second sensing device $C_{RX2}$; and the third input of the differential amplifier 40 is used for receiving the common-mode voltage $V_{CM}$. By using the first input of the differential amplifier 40 to receive the first sensing signal S1 and the second input to receive the second sensing signal S2, and by using the approximate characteristics of the adjacent first sensing device $C_{RX1}$ and the second sensing device $C_{RX2}$, the common-mode noise of the differential amplifier 40 may be cancelled. Hence, difference between the prior art and the present invention, according to the prior art, since the single-ended amplifiers are adopted, the common-mode noise cannot be cancelled. Besides, the problem of saturated sensing signals at outputs of the sensing devices owing to larger capacitance of sensing devices cannot be avoided.

According to the present embodiment, the differential amplifying circuit 10 further includes a first capacitor $C_{FB1}$, a second capacitor $C_{FB2}$, a first switch SW1, and a second switch SW2. According to an embodiment of the present invention, the first capacitor $C_{FB1}$ of the differential amplifying circuit 10 is coupled with the first switch SW1 in parallel and coupled between the first input and the first output of the differential amplifying circuit 10. Besides, the first capacitor $C_{FB1}$ corresponds to the first sensing signal S1 of the first sensing device $C_{RX1}$. The second capacitor $C_{FB2}$; of the differential amplifying circuit 10 is coupled with the second switch SW2 in parallel and coupled between the second input and the second output of the differential amplifying circuit 10. Besides, the second capacitor $C_{FB2}$ corresponds to the second sensing signal S2 of the second sensing device $C_{RX2}$. The differential amplifying circuit 10 generates the output signals $V_{OP}$ and $V_{ON}$ according to the common-mode voltage $V_{CM}$, the first sensing signal S1, and the second sensing signal S2.

Figure 4:
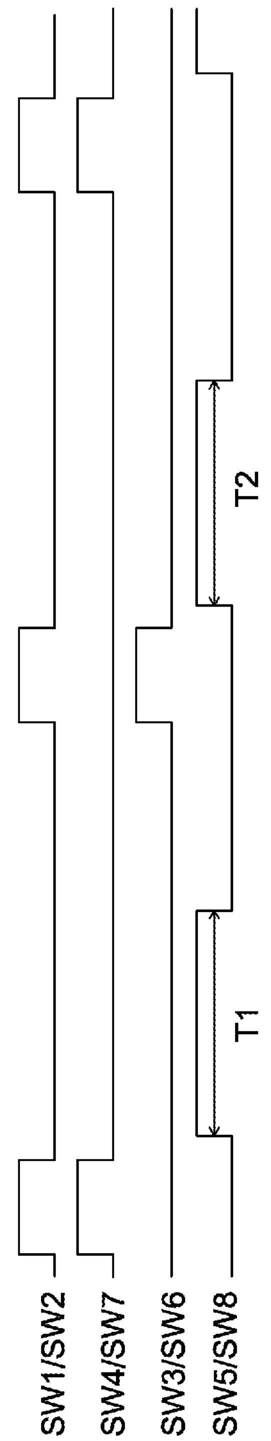
FIG. 4 shows a waveform diagram of the sensing circuit with signal compensation according the first embodiment of the present invention.

Please refer to FIG. 4, which shows a waveform diagram of the sensing circuit with signal compensation according the first embodiment of the present invention. According to the present embodiment, the differential amplifying circuit 10 according to the present invention includes the charge/discharge stage of touch panel and the charge transfer stage. In the charge/discharge stage of touch panel, the fifth switch SW5 of the first switching circuit 20 and the eighth switch SW8 of the second switching circuit 30 are open. At this moment, the fourth switch SW4 (or the third switch SW3) and the seventh switch SW7 of the second switching circuit 30 (or the sixth switch SW6 of the second switching circuit 30) are closed. Thereby, the first sensing device $C_{RX1}$ is charged to the first driving voltage $VDD_1$ (or the first sensing device $C_{RX1}$ is discharged to the first ground $GND_1$); and the second sensing device $C_{RX2}$ is charged to the second driving voltage $VDD_2$ (or the second sensing device $C_{RX2}$ is discharged to the second ground $GND_2$). Meanwhile, the differential amplifier 40 is reset so that the output voltages $V_{OP}$, $V_{ON}$ are close to the common-mode voltage $V_{CM}$.

According to the present embodiment, in the charge transfer stage of the differential amplifying circuit 10, the fifth switch SW5 of the first switching circuit 20 and the eighth switch SW8 of the second switching circuit 30 are closed, while the fourth switch SW4 of the first switching circuit 20 (or the third switch SW3 of the first switching circuit 20) and the seventh switch SW7 of the second switching circuit 30 (or the sixth switch SW6 of the second switching circuit 30) are open. At this time, the first sensing device $C_{RX1}$ is discharged from the first driving voltage $VDD_1$ to the common-mode voltage $V_{CM}$, or the first sensing device $C_{RX1}$ is charged from the first ground $GND_1$ to the common-mode voltage $V_{CM}$; the second sensing device $C_{RX2}$ is discharged from the second driving voltage $VDD_2$ to the common-mode voltage $V_{CM}$, or the second sensing device $C_{RX2}$ is charged from the second ground $GND_2$ to the common-mode voltage $V_{CM}$. Then charges are transferred to the differential amplifying circuit 10. In a first conduction time T1 or a second conduction time T2, the first sensing signal S1 and the second sensing signal S2 are inputted to the differential amplifier 40 and thus further generating the output signals $V_{OP}$, $V_{ON}$, as expressed in the following equation (1):

$$V_{OP} = V_{CM} + \frac{1}{2}\frac{C_{RX1}}{C_{FB}}(V_{DD} - V_{CM}) - \frac{1}{2}\frac{C_{RX2}}{C_{FB}}(V_{DD} - V_{CM}) \tag{1}$$

As shown in FIG. 3, by canceling out the first sensing signal S1 of the first sensing device $C_{RX1}$ at the first capacitor $C_{FB1}$ and the second sensing signal S2 of the second sensing device $C_{RX2}$ at the second capacitor $C_{FB2}$, the output signals $V_{OP}$, $V_{ON}$ are approximate or equal to the common-mode voltage $V_{CM}$. Thereby, the noise caused by the parasitic capacitance between the display electrodes and the touch-panel electrodes will be improved and thus reducing the problem of circuit noise.

Figure 5:
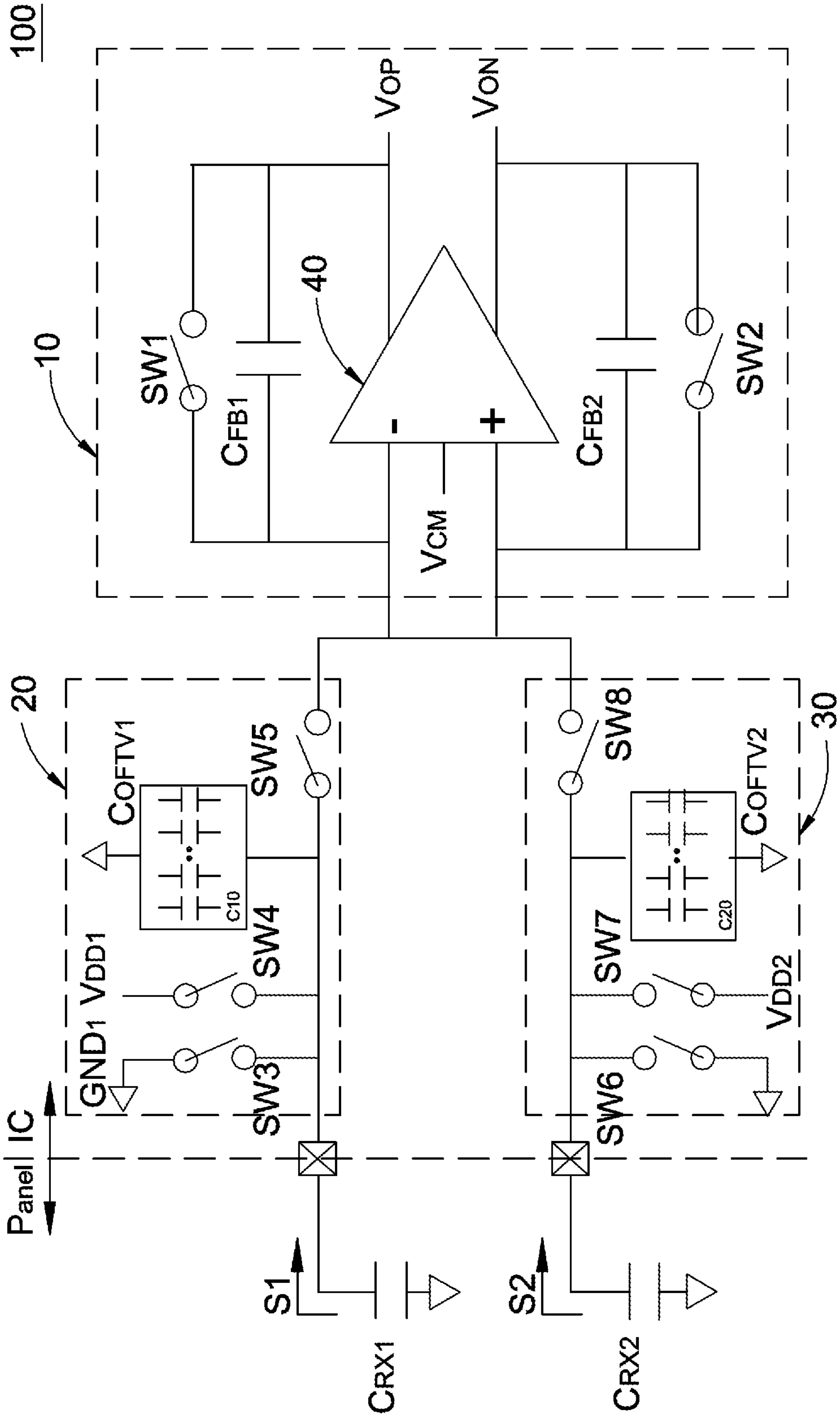
FIG. 5 shows a circuit diagram of the sensing circuit with signal compensation according the second embodiment of the present invention.

Please refer to FIG. 5, which shows a circuit diagram of the sensing circuit with signal compensation according the second embodiment of the present invention. The sensing circuit 100 with signal compensation according to the present invention further comprises a first capacitor bank $C_{OFTV1}$ and a second capacitor bank $C_{OFTV2}$. The first capacitor bank $C_{OFTV1}$ is coupled between the first sensing device $C_{RX1}$ and the differential amplifying circuit 10, and incudes one or more first matching capacitor C10 for matching and compensating the first sensing device $C_{RX1}$ and the differential amplifying circuit 10. The second capacitor bank $C_{OFTV2}$ is coupled between the second sensing device $C_{RX2}$ and the differential amplifying circuit 10, and incudes one or more second matching capacitor C20 for matching and compensating the second sensing device $C_{RX2}$ and the differential amplifying circuit 10. According to an embodiment of the present invention. By using the approximation between the first sensing device $C_{RX1}$ and the second sensing device $C_{RX2}$ on adjacent channels, and using the one or more first matching capacitor C10 of the first capacitor bank $C_{OFTV1}$ and the one or more second matching capacitor C20 of the second capacitor bank $C_{OFTV2}$, the common-mode signal input to the differential amplifier 40 may be cancelled and hence making the output signals $V_{OP}$, $V_{ON}$ approximate to the common-mode voltage $V_{CM}$. In addition, the problem of output saturation may be solved as well, as expressed in the following equation (2):

$$V_{OP} = V_{CM} + \frac{1}{2}\frac{C_{RX1} + C_{OFTV1}}{C_{FB}}(V_{DD} - V_{CM}) - \frac{1}{2}\frac{C_{RX2} + C_{OFTV2}}{C_{FB}}(V_{DD} - V_{CM}) \tag{2}$$

As shown in FIG. 5, one terminal of the first capacitor bank $C_{OFTV1}$ is coupled to the first sensing device $C_{RX1}$ and the other terminal is only connected to the ground; one terminal of the second capacitor bank $C_{OFTV2}$ is coupled to the second sensing device $C_{RX2}$ and the other terminal is only connected to the ground. Thereby, no switching on capacitors is required. In a touch panel, if the first sensing device $C_{RX1}$ is different from the second sensing device $C_{RX2}$, by adopting the first capacitor bank $C_{OFTV1}$ and the second capacitor bank $C_{OFTV2}$, the first sensing device $C_{RX1}$+ the first capacitor bank $C_{OFTV1}$=the second sensing device $C_{RX2}$+ the second capacitor bank $C_{OFTV2}$. Then the mismatch problem due to difference between the first sensing device $C_{RX1}$ and the second sensing device $C_{RX2}$ will be solved. Consequently, compared with the prior art, the noise introduced by the compensation circuit is reduced significantly according to the present invention.

To sum up, the present invention provides a sensing circuit with signal compensation, which comprises a first sensing device, a second sensing device, and a differential amplifying circuit. The differential amplifying circuit generates an output signal by differential compensation using the differential amplifying circuit according to a common-mode voltage, a first sensing signal, and a second sensing signal. In addition to reducing noise in the sensing circuit, the interference from the display driving signals may be improved effectively. Besides, by adopting a first capacitor bank and a second capacitor bank according to the present invention, the first sensing device is matched with the second sensing device effectively. By compensating the differential amplifying circuit, the noises in the differential amplifying circuit may be reduced significantly.

The invention claimed is:

1. A sensing circuit with signal compensation, comprising:

a first sensing device, receiving a first driving voltage, and generating a first sensing signal;

a second sensing device, receiving a second driving voltage, and generating a second sensing signal; and a differential amplifying circuit, coupled to a common-mode voltage, said first sensing device, and said second sensing device, and generating an output signal by a differential compensation according to said common-mode voltage, said first sensing signal, and said second sensing signal while said common-mode voltage, said first sensing signal, and said second sensing signal are respectively provided to said differential amplifying circuit, said output signal is approximate or equal to said common-mode voltage by canceling out said first sensing signal of said first sensing device and said second sensing signal of said second sensing device.

2. The sensing circuit with signal compensation of claim 1, further comprising:

a first capacitor bank, coupled between said first sensing device and said differential amplifying circuit, and including one or more first matching capacitor; and a second capacitor bank, coupled between said second sensing device and said differential amplifying circuit, and including one or more second matching capacitor.

3. The sensing circuit with signal compensation of claim 1, wherein said differential amplifying circuit further includes:

a differential amplifier, including a first input, a second input, a third input, a first output, and a second output, said first input receiving said first sensing signal of said first sensing device, said second input receiving said second sensing signal of said second sensing device, and said third input receiving said common-mode voltage;

a first capacitor, coupled between said first input and said first output of said differential amplifier, and corresponding to said first sensing signal of said first sensing device; and a second capacitor, coupled between said second input and said second output of said differential amplifier, and corresponding to said second sensing signal of said second sensing device;

where said differential amplifying circuit generates said output signal by canceling out said first sensing signal of said first sensing device at said first capacitor and said second sensing signal of said second sensing device at said second capacitor according to said common-mode voltage, said first sensing signal, and said second sensing signal, and said output signal is approximate or equal to said common-mode voltage.

4. The sensing circuit with signal compensation of claim 3, further comprising:

a first switch, coupled to said first capacitor, and coupled to said first input and said first output of said differential amplifier; and a second switch, coupled to said second capacitor, and coupled to said second input and said second output of said differential amplifier.

5. The sensing circuit with signal compensation of claim 1, further comprising a first switching circuit, including:

a third switch, with one terminal coupled to said first sensing device and the other terminal coupled to a first ground;

a fourth switch, with one terminal coupled to said first sensing device and the other terminal coupled to a first driving voltage; and a fifth switch, with one terminal coupled to said first sensing device and the other terminal coupled to said differential amplifying circuit.

6. The sensing circuit with signal compensation of claim 1, further comprising a second switching circuit, including:

a sixth switch, with one terminal coupled to said second sensing device and the other terminal coupled to a second ground;

a seventh switch, with one terminal coupled to said second sensing device and the other terminal coupled to a second driving voltage; and an eighth switch, with one terminal coupled to said second sensing device and the other terminal coupled to said differential amplifying circuit.

* * * * *